US007800909B2

(12) United States Patent
Sun

(10) Patent No.: US 7,800,909 B2
(45) Date of Patent: Sep. 21, 2010

(54) LAMP BASE HAVING A HEAT SINK

(75) Inventor: Tsung-Ting Sun, Chung-Ho (TW)

(73) Assignee: Edison Opto Corporation, Taipet (TW)

( * ) Notice: Subject to any disclaimer, the term of this patent is extended or adjusted under 35 U.S.C. 154(b) by 71 days.

(21) Appl. No.: 12/258,595

(22) Filed: Oct. 27, 2008

(65) Prior Publication Data

US 2010/0103621 A1 Apr. 29, 2010

(51) Int. Cl.
*H05K 7/20* (2006.01)
*F21V 29/00* (2006.01)

(52) U.S. Cl. ....................... 361/709; 361/707; 361/717; 361/720; 361/722; 362/294; 362/345; 362/373

(58) Field of Classification Search ................. 361/704, 361/709, 707, 717, 720, 722; 362/294, 345, 362/373
See application file for complete search history.

(56) References Cited

U.S. PATENT DOCUMENTS

| | | | | |
|---|---|---|---|---|
| 1,343,690 | A * | 6/1920 | Smith | 338/57 |
| 4,527,225 | A * | 7/1985 | Hartman | 362/294 |
| 4,600,979 | A * | 7/1986 | Fisher et al. | 362/373 |
| 4,841,422 | A * | 6/1989 | Groh | 362/294 |
| 5,099,399 | A * | 3/1992 | Miller et al. | 362/580 |
| 5,154,507 | A * | 10/1992 | Collins | 362/218 |
| 5,738,436 | A * | 4/1998 | Cummings et al. | 362/294 |
| 6,799,864 | B2 * | 10/2004 | Bohler et al. | 362/236 |
| 6,974,233 | B1 * | 12/2005 | Aubrey | 362/294 |
| 7,198,387 | B1 * | 4/2007 | Gloisten et al. | 362/294 |
| D573,111 | S * | 7/2008 | Liu et al. | D13/179 |
| 7,396,146 | B2 * | 7/2008 | Wang | 362/294 |
| 7,420,811 | B2 * | 9/2008 | Chan | 361/709 |
| 7,524,089 | B2 * | 4/2009 | Park | 362/294 |
| 7,540,636 | B2 * | 6/2009 | Lai et al. | 362/373 |
| 7,549,774 | B2 * | 6/2009 | Tsai | 362/294 |
| 7,600,897 | B2 * | 10/2009 | Tsai | 362/294 |
| 2001/0030866 | A1 * | 10/2001 | Hochstein | 362/294 |
| 2002/0176250 | A1 * | 11/2002 | Bohler et al. | 362/236 |
| 2004/0095782 | A1 * | 5/2004 | Isoda | 362/555 |
| 2005/0052870 | A1 * | 3/2005 | Vamberi | 362/294 |
| 2006/0002125 | A1 * | 1/2006 | Kim et al. | 362/509 |
| 2006/0050507 | A1 * | 3/2006 | Morrow et al. | 362/227 |

(Continued)

FOREIGN PATENT DOCUMENTS

JP 05144309 A * 6/1993

*Primary Examiner*—Anatoly Vortman
(74) *Attorney, Agent, or Firm*—Chun-Ming Shih; HDLS IPR Services

(57) ABSTRACT

A lamp base having a heat sink is connected to a bulb having two electrodes. The lamp base includes a heat sink, a first electrically conductive piece, a second electrically conductive piece, and leads. The heat sink comprises a heat-dissipating base formed with a trough for accommodating the bulb therein. The first electrically conductive piece is fixed in the trough and is electrically connected to an electrode of the bulb. The second electrically conductive piece is fixed in the trough and is electrically connected to the other electrode of the bulb. The second electrically conductive piece is electrically insulated from the first electrically conductive piece. The leads are electrically connected to the first electrically conductive piece and the second electrically conductive piece respectively. With the heat sink dissipating the heat generated by the bulb, the lamp base has extended lifetime.

8 Claims, 3 Drawing Sheets

U.S. PATENT DOCUMENTS

2006/0050514 A1* 3/2006 Opolka ........................ 362/294
2006/0180821 A1* 8/2006 Fan et al. ....................... 257/98
2006/0193139 A1* 8/2006 Sun et al. .................... 362/373
2006/0250803 A1* 11/2006 Chen .......................... 362/373
2007/0247853 A1* 10/2007 Dorogi ....................... 362/294
2008/0055908 A1* 3/2008 Wu et al. .................... 362/294
2010/0027258 A1* 2/2010 Maxik et al. ................ 362/240

* cited by examiner

LAMP BASE HAVING A HEAT SINK

BACKGROUND OF THE INVENTION

1. Field of the Invention

The present invention relates to a lamp base, and in particular to a lamp base having a heat sink.

2. Description of Prior Art

A conventional lamp base includes a fixing base, an insulator and a lead. The fixing base is electrically connected to a bulb. The insulator covers the outside of the fixing base. The lead is electrically connected to the fixing base thereby to provide electricity.

Since the fixing base is electrically connected to the bulb, the heat generated during the operation of bulb will be transferred to the fixing base. For the user's safety, the outside of the fixing base will be covered with a layer of insulator, thereby lowering the temperature on the surface of the lamp base.

However, in practice, such a conventional lamp base still has drawbacks as follows. As the light-emitting power of the bulb increases, the amount of generated heat also increases correspondingly. Therefore, when in use, the heat will be accumulated in the fixing base and cannot be dissipated to the outside. Furthermore, the fixing base is covered by the insulator, which makes it difficult to dissipate the heat to the outside. As a result, the elements within the fixing base may be burned and thus the lamp base cannot be used normally.

Therefore, it is an important issue for the present Inventor to overcome the above problems.

SUMMARY OF THE INVENTION

One objective of the present invention is to provide a lamp base having a heat sink. With the heat sink dissipating the heat generated by the bulb, the heat-dissipating efficiency of the lamp base can be enhanced, and the lamp base can be operated normally.

Accordingly, the present invention provides a lamp base having a heat sink, which is connected to a bulb having two electrodes. The lamp base includes a heat sink, a first electrically conductive piece, a second electrically conductive piece, and a plurality of leads. The heat sink comprises a heat-dissipating base. The heat-dissipating base is formed with a trough for accommodating the bulb therein. The first electrically conductive piece is fixed in the trough and is electrically connected to an electrode of the bulb. The second electrically conductive piece is fixed in the trough and is electrically connected to the other electrode of the bulb. The second electrically conductive piece is electrically insulated from the first electrically conductive piece. The leads are electrically connected to the first electrically conductive piece and the second electrically conductive piece respectively.

Another objective of the present invention is to provide a lamp base having a heat sink. With the heat-dissipating pieces of the heat sink dissipating the heat generated by the bulb, the lamp base may not operate in a high temperature for a long time, thereby extending the life time thereof.

The third objective of the present invention is to provide a lamp base having a heat sink. With a heat-dissipating fan provided on one side of the heat-dissipating pieces, the heat-dissipating efficiency of the lamp base can be enhanced.

The fourth objective of the present invention is to provide a lamp base having a heat sink. Since the heat sink comprises heat pipes and heat-dissipating fins, the heat generated by the bulb can be transferred to the heat-dissipating fins more quickly, so that the heat-conducting and heat-dissipating efficiency of the lamp base can be enhanced.

DETAILED DESCRIPTION OF THE INVENTION

The detailed description and technical contents of the present invention will be explained with reference to the accompanying drawings. However, the drawings are for illustrative purpose and should not limit the scope of present invention.

Figure 1:
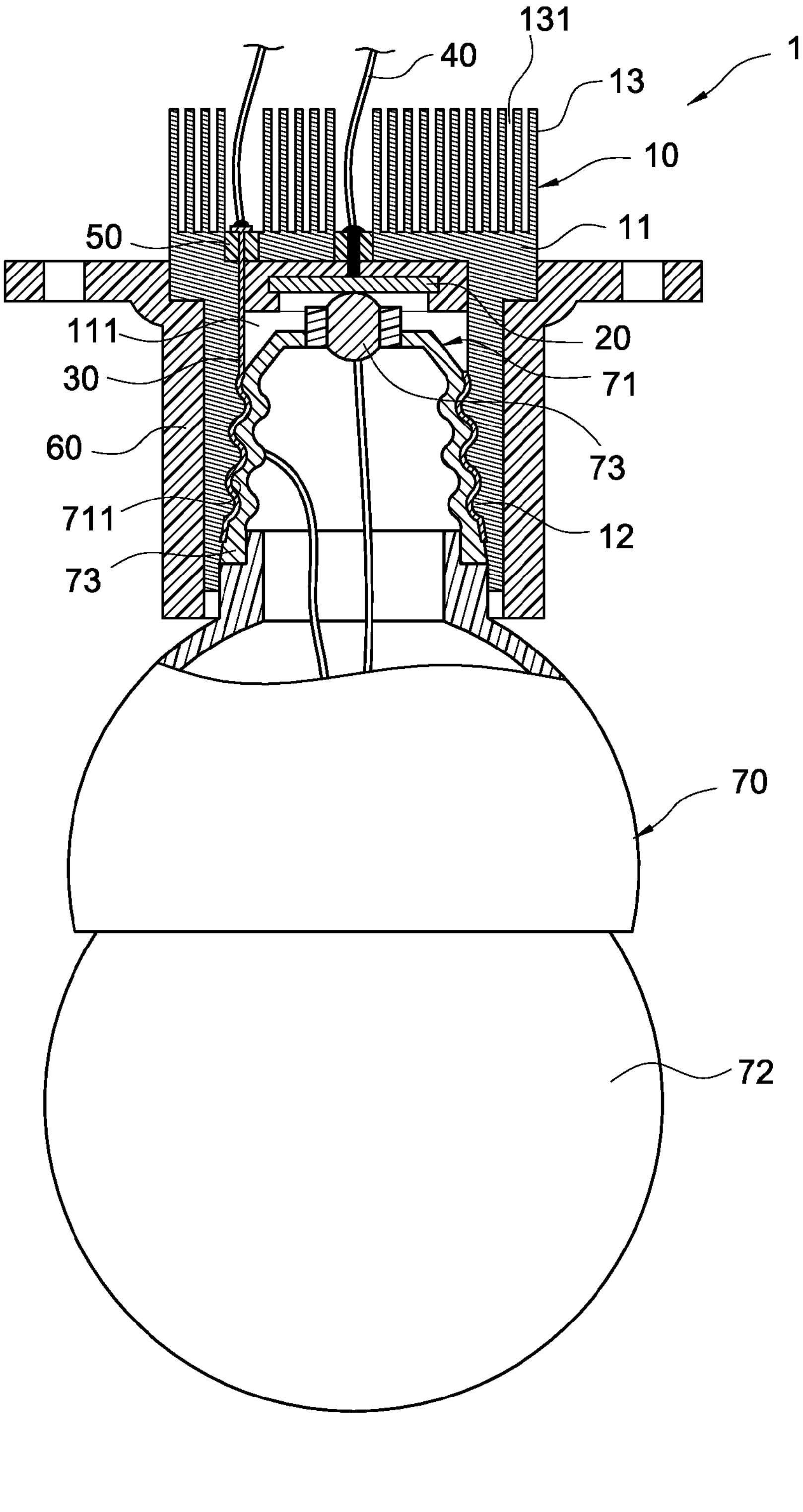
FIG. 1 is a cross-sectional view of the present invention.

Please refer to FIG. 1, which is a cross-sectional view of the present invention. The present invention provides a lamp base having a heat sink, which is connected to a bulb 70 having two electrodes 73. The lamp base 1 includes a heat sink 10, a first electrically conductive piece 20, a second electrically conductive piece 30, a plurality of leads 40, and an insulating layer 60.

The insulating layer 60 is made of plastics, but it is not limited thereto. The heat sink 10 comprises a heat-dissipating base 11. The insulating layer 60 partially covers the outside of the heat-dissipating base 11. The heat-dissipating base 11 is formed with a trough 111 for accommodating the bulb 70. The inner wall of the trough 111 is formed with an inner thread 12. The surface of the heat-dissipating base 11 is subjected to an anodic treatment so as to provide insulation.

The first electrically conductive piece 20 is electrically connected to one electrode 73 of the bulb 70. The first electrically conductive piece 20 is fixed to the bottom and inside of trough 111. The second electrically conductive piece 30 is connected to the other electrode 73 of the bulb 70. The second electrically conductive piece 30 is fixed to a side wall within the trough 111 and is electrically insulated from the first electrically conductive piece 20. Further, the shape of the second electrically conductive piece 30 corresponds to that of the inner thread 12. The leads 40 are electrically connected to the first electrically conductive piece 20 and the second electrically conductive piece 30 respectively.

The bulb 70 comprises a head portion 71 and a light-emitting portion 72 connected to the head portion 71. One end of the head portion 71 is connected to the two electrodes 73. The two electrodes 73 are insulated from each other. The outer wall of the head portion 71 is formed with an outer thread 711 corresponding to the inner thread 12. The inner thread 12 and the outer thread 711 are threadedly connected with each other, thereby fixing the bulb 70 to the heat-dissipating base 11.

More specifically, in the present embodiment, the heat-dissipating base 11 extends to form a plurality of heat-dissipating fins 13. The heat-dissipating fins 13 are arranged at intervals. A heat-dissipating passage 131 is formed between any two adjacent heat-dissipating fins 13. In this way, the heat generated by the bulb 70 can be conducted to the heat-dissipating fins 13 via the heat-dissipating base 11. The heat is further dissipated via the heat-dissipating passages 131 between the heat-dissipating fins 13, thereby lowering the temperature of the heat-dissipating base 11.

Further, the connecting portions between the leads 40 and the heat-dissipating base 11 are inserted with a plurality of heat-insulating blocks 50. The heat-insulating blocks 50 are used to prevent the leads 40 from contacting the heat-dissipating base 11 directly and thus avoid the leads 40 from burning due to an excessively high temperature on heat-dissipating base 11.

Figure 2:
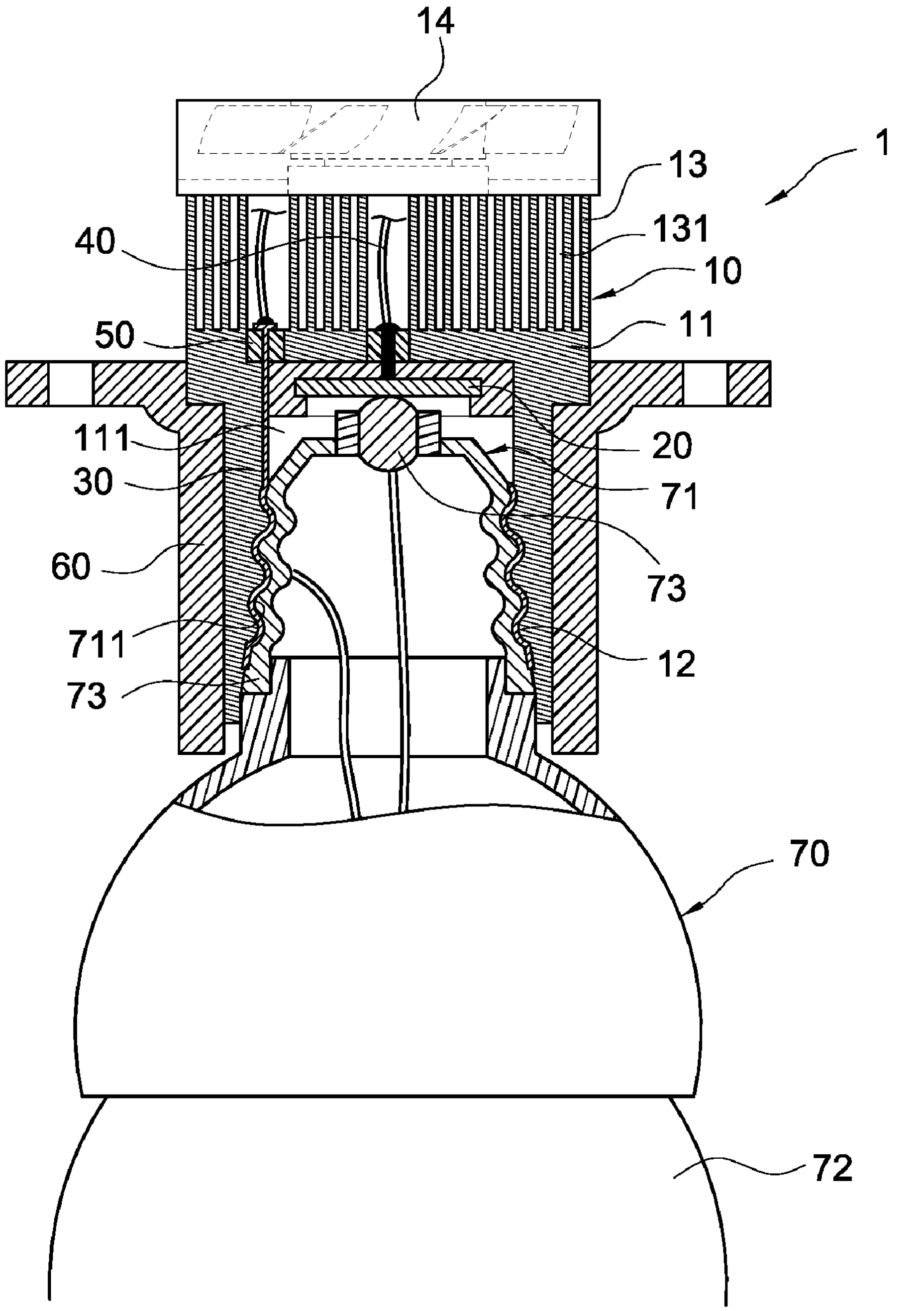
FIG. 2 is a cross-sectional view showing the second embodiment of the present invention.

Please refer to FIG. 2, which is a cross-sectional view of the second embodiment of the present invention. In the present embodiment, the heat sink 10 further comprises a heat-dissipating fan 14 that is provided on one side of the heat-dissipating piece 13. Via the forced airflow flowing from the heat-dissipating fan 14 toward the heat-dissipating pieces 13, the heat can be removed more quickly, thereby enhancing the heat-dissipating efficiency of the whole lamp base 1.

Figure 3:
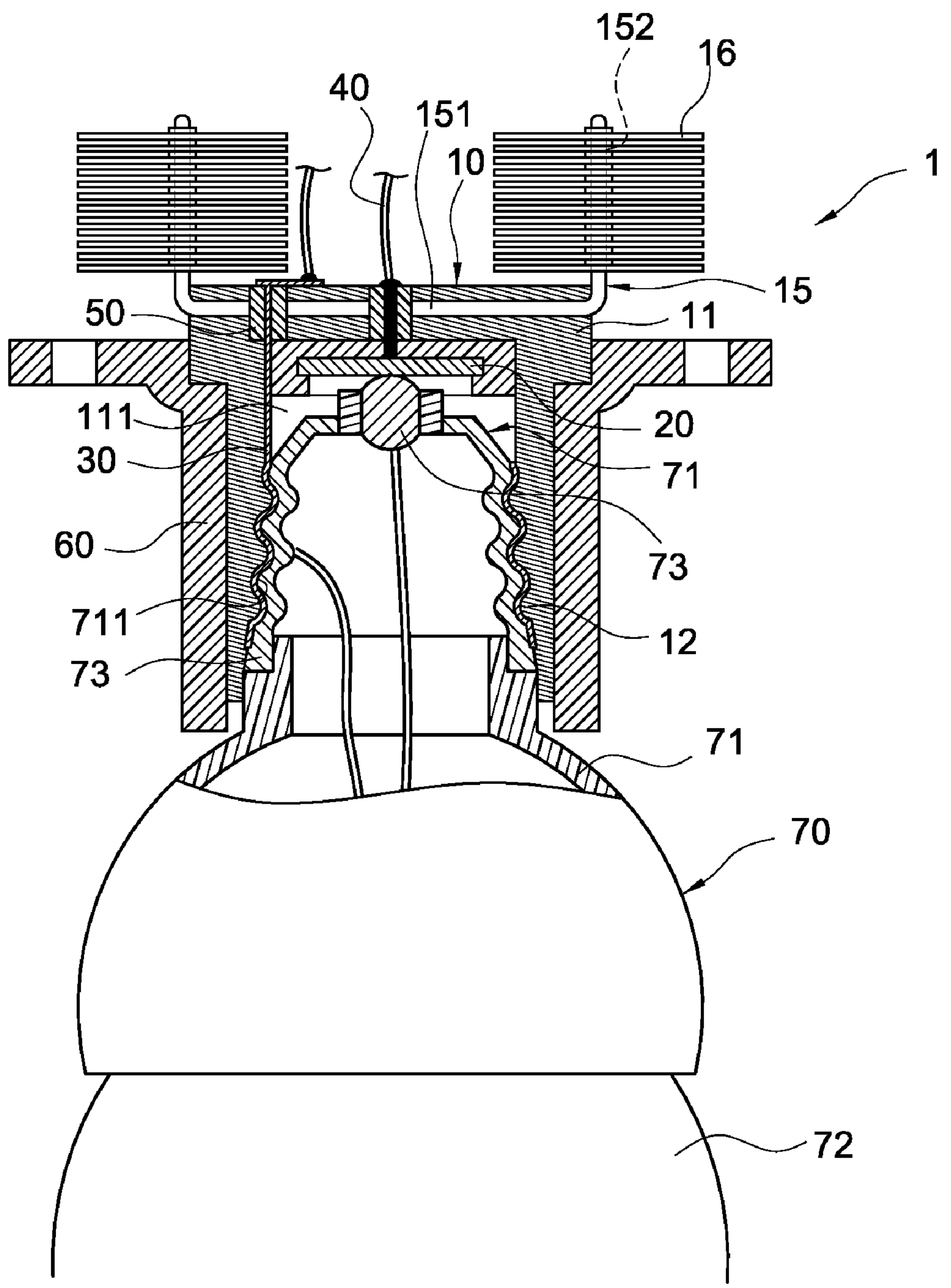
FIG. 3 is a cross-sectional view showing the third embodiment of the present invention.

Please refer to FIG. 3, which is a cross-sectional view of the third embodiment of the present invention. In the third embodiment of present invention, the heat-dissipating base 11 is connected to a plurality of heat pipes 15 and heat-dissipating fins 16. The heat-dissipating fins 16 passes through the heat pipes 15 and are arranged at intervals. More specifically, the heat pipe 15 comprises a heat-absorbing section 151 and a heat-releasing section 152 extending from the heat-absorbing section 151. The heat-absorbing section 151 corresponds to the heat-dissipating base 11. The heat-dissipating fins 16 correspond to the heat-releasing section 152. The heat pipe 15 is formed into a U shape. Via the phase changes of the working liquid within the heat pipes 15, the heat generated by the bulb can be transferred quickly. In this way, the heat-conducting and heat-dissipating efficiency of the lamp base 1 can be enhanced.

According to the above, the lamp base having a heat sink according to the present invention demonstrates industrial applicability. Further, the structure of the present invention has not been seen in articles of the same kind or let in public use. Therefore, the present invention conforms to the requirements for an invention patent.

What is claimed is:

1. A lamp base having a heat sink for connecting to a bulb having two electrodes, the lamp base comprising:

a heat sink having a heat-dissipating base, the heat-dissipating base being formed with a trough for accommodating the bulb therein and a first opening at a center portion of the heat-dissipating base and a second opening at a peripheral portion of the heat-dissipating base;

a first electrically conductive piece fixed in the trough and electrically connected to an electrode of the bulb;

a thread-shaped second electrically conductive piece fixed in the trough and electrically connected to the other thread-shaped electrode of the bulb, the thread-shaped second electrically conductive piece being electrically insulated from the first electrically conductive piece and placed between an inner thread on an inner wall of the trough and the thread-shaped electrode of the bulb; and a plurality of leads electrically connected to the first electrically conductive piece through the first opening and the second electrically conductive piece through the second opening respectively, wherein the inner wall of the trough is formed with the inner thread for threadedly connecting to the bulb and the second electrically conductive piece is fixed to the inner wall with a shape corresponding to that of the inner thread.

2. The lamp base having a heat sink according to claim 1, wherein the heat-dissipating base extends to form a plurality of heat-dissipating fins that are arranged at intervals.

3. The lamp base having a heat sink according to claim 2, wherein a heat-dissipating passage is formed between two adjacent heat-dissipating fins.

4. The lamp base having a heat sink according to claim 3, wherein the heat sink further comprises a heat-dissipating fan on one side of the heat-dissipating fins.

5. The lamp base having a heat sink according to claim 1, wherein the heat sink further comprises a heat pipe connected to the heat-dissipating base and a plurality of heat-dissipating fins through which the heat pipe penetrates.

6. The lamp base having a heat sink according to claim 5, wherein the heat pipe comprises a heat-absorbing section and a heat-releasing section extending from the heat-absorbing section, the heat-absorbing section is connected to the heat-dissipating base, the heat-dissipating fins are connected to the heat-releasing section.

7. The lamp base having a heat sink according to claim 1, further comprises an insulating layer, the insulating layer partially covering the outside of the heat-dissipating base.

8. The lamp base having a heat sink according to claim 1, further comprises a plurality of heat-insulating blocks inserted into the first opening and the second opening, respectively, to prevent the leads from contacting the heat-dissipating base.

* * * * *